United States Patent
Viktorovitch et al.

(10) Patent No.: US 6,943,384 B2
(45) Date of Patent: Sep. 13, 2005

(54) SEMICONDUCTOR OPTOELECTRONIC DEVICE WITH ELECTRICALLY ADJUSTABLE TRANSFER FUNCTION

(75) Inventors: Pierre Viktorovitch, Tassin-la-Demi-Lune (FR); Jean-Louis Leclercq, Morance (FR); Christian Seassal, Lyons (FR); Alain Spisser, Lyons (FR); Michel Garrigues, La Tour de Salvagny (FR)

(73) Assignees: Centre National de la Recherche Scientifique, Paris (FR); Ecole Centrale de Lyon, Ecully (FR)

( * ) Notice: Subject to any disclaimer, the term of this patent is extended or adjusted under 35 U.S.C. 154(b) by 420 days.

(21) Appl. No.: 10/233,848

(22) Filed: Sep. 3, 2002

(65) Prior Publication Data

US 2003/0107034 A1 Jun. 12, 2003

Related U.S. Application Data

(63) Continuation of application No. PCT/FR01/00547, filed on Feb. 23, 2001.

(30) Foreign Application Priority Data

| Mar. 3, 2000 | (FR) | ............................................ 00 02787 |
| Feb. 23, 2001 | (FR) | ............................................ 01 00547 |

(51) Int. Cl.$^7$ ................. H01L 31/0328; H01L 31/0336; H01L 31/072; H01L 31/109
(52) U.S. Cl. ........................................ 257/189; 257/184
(58) Field of Search ................................ 257/189, 184, 257/120, 21

(56) References Cited

U.S. PATENT DOCUMENTS

| 4,600,935 A | * | 7/1986 | Dresner ........................ 257/52 |
| 5,629,951 A | | 5/1997 | Chang-Hasnain et al. |
| 5,771,253 A | | 6/1998 | Chang-Hasnain et al. |
| 6,646,318 B1 | * | 11/2003 | Hopper et al. .............. 257/440 |

* cited by examiner

Primary Examiner—Phat X. Cao
(74) Attorney, Agent, or Firm—Alston & Bird LLP

(57) ABSTRACT

The invention concerns an optoelectronic device comprising at alteration of at least three semiconductor layers with selected shape, and two air layers. The semiconductor layers having N-type or P-type doping which may differ or not from one layer to the next layer, are separated by spacers whereof the doping is non-intentional (I-type) or intentional (N-type or P-type) to define a PINIP or NIPIN structure with air cavities, and are adapted to be set at selected respective electric potentials. The respective thicknesses and compositions of the layers and the spacers are selected so that the structure has at least an optical transfer function adapted to light to be treated and adjustable in accordance with the selected potentials applied to the semiconductor layers.

14 Claims, 3 Drawing Sheets

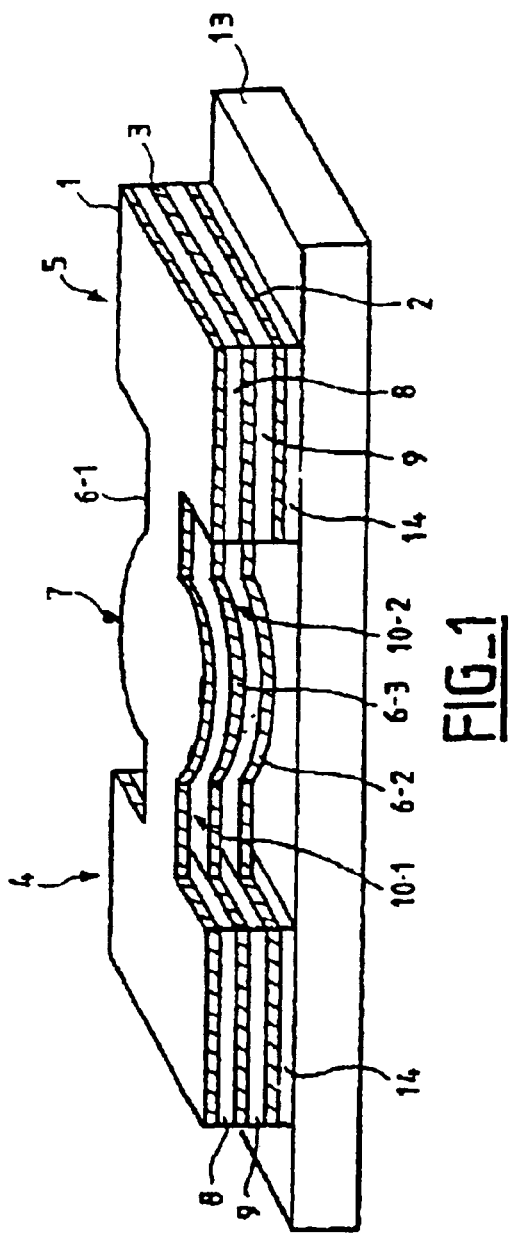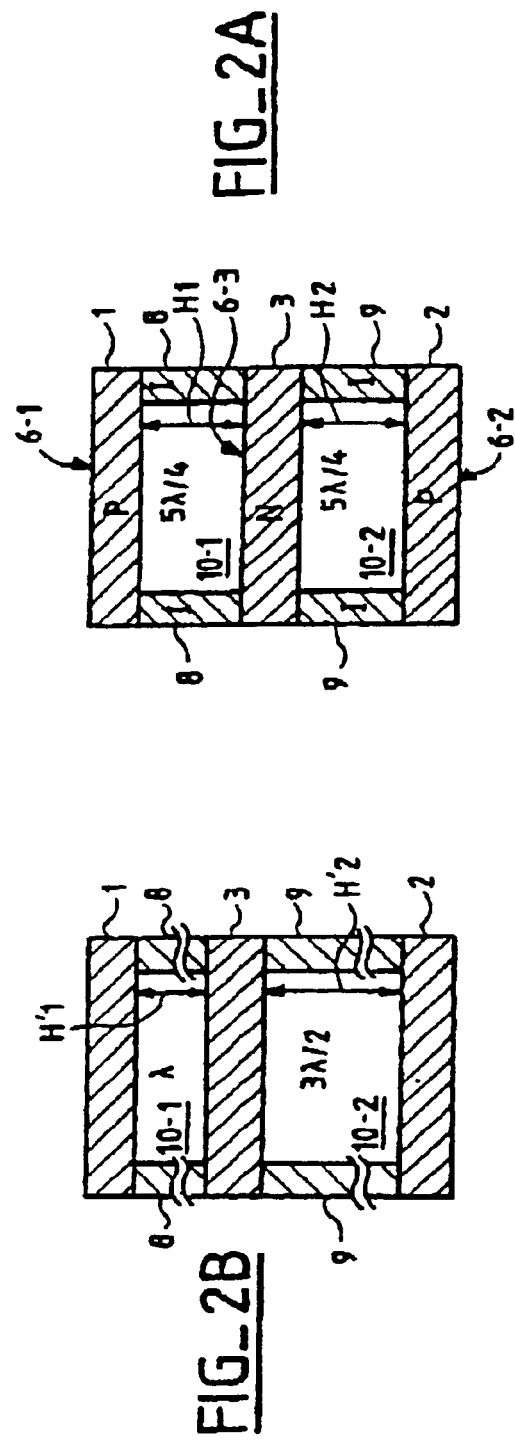

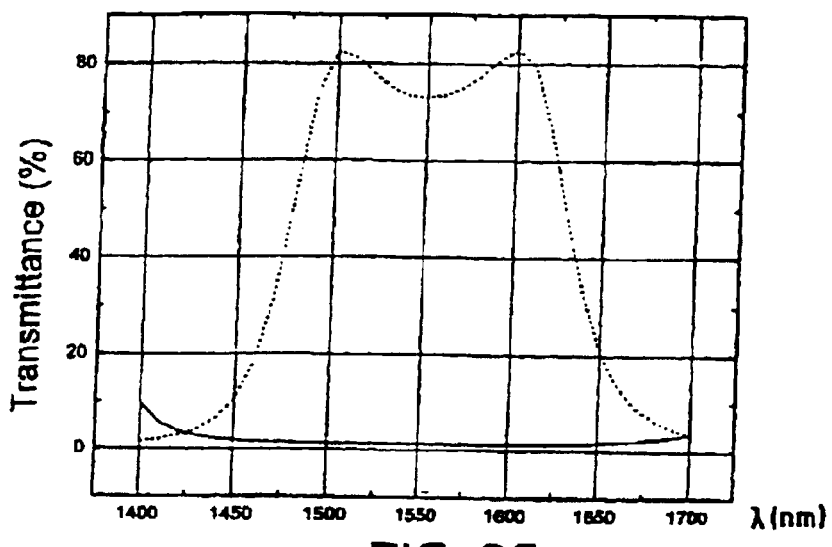
FIG_2C
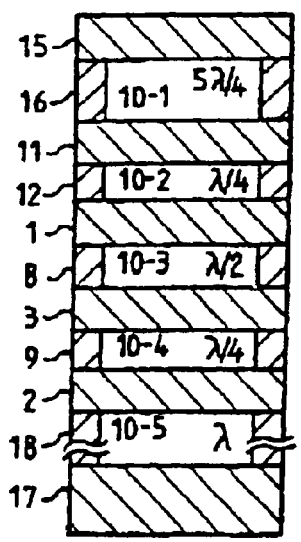
FIG_3C
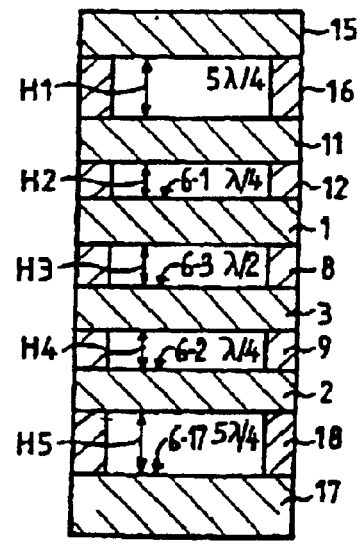
FIG_3A
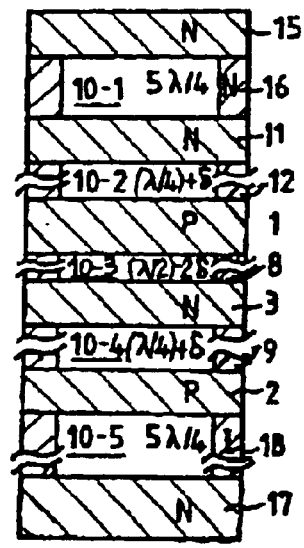
FIG_3B

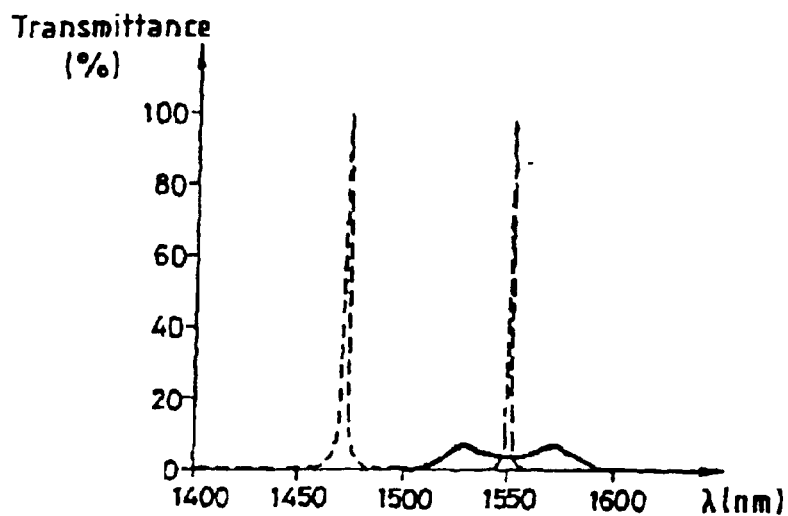
FIG_4
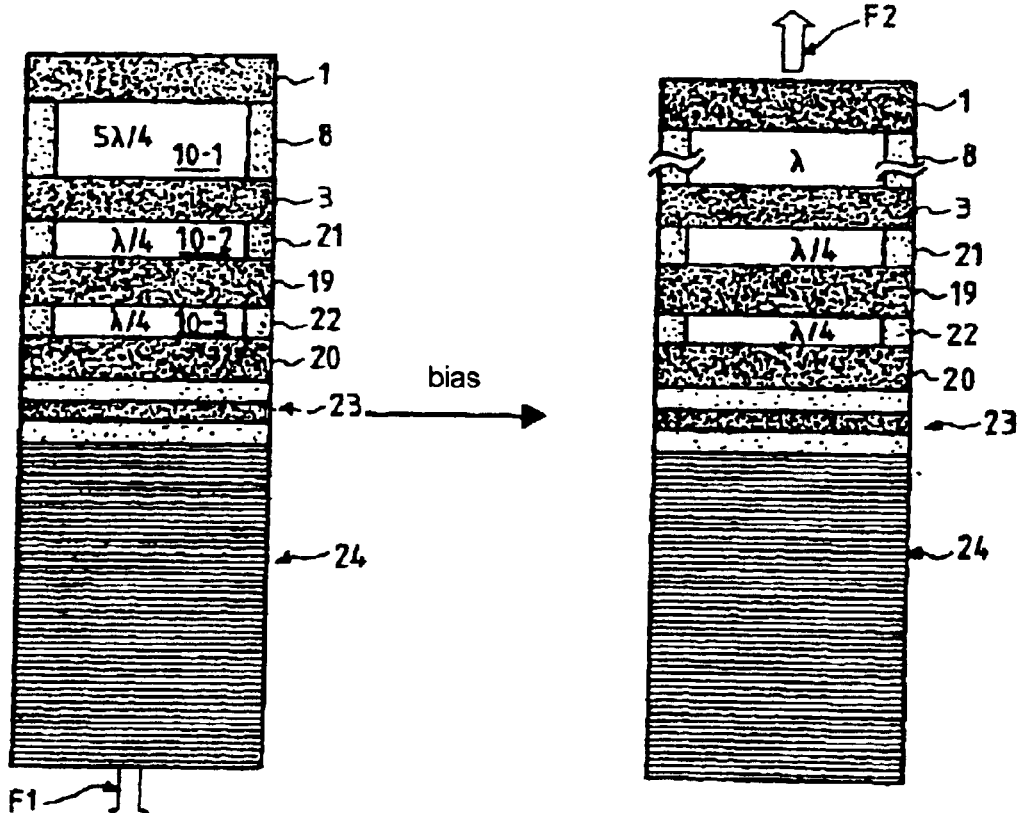
FIG_5A    FIG_5B

SEMICONDUCTOR OPTOELECTRONIC DEVICE WITH ELECTRICALLY ADJUSTABLE TRANSFER FUNCTION

CROSS-REFERENCE TO RELATED APPLICATIONS

This application is a continuation of International Application No. PCT/FR 01/00547, filed Feb. 23, 2001.

BACKGROUND OF THE INVENTION

The invention relates to semiconductor optoelectronic devices with electrically adjustable spectral transfer functions, and especially micro-opto-electro-mechanical (MOEM) devices.

MOEM devices are described in U.S. Pat. Nos. 5,629,951 and 5,771,253 (Chang-Hasnain et al.). To be more precise, they comprise a lower Bragg mirror and an upper Bragg mirror constituted of alternating semiconductor materials with different refractive indices. The two Bragg mirrors are spaced from each other by semiconductor spacers, to define a vertical Fabry-Pérot cavity filled with air. One of the mirrors can be deformed by electrostatic means to vary the thickness of the air cavity and thereby to vary the spectral response of the Fabry-Pérot cavity. The structure can therefore operate as a tunable wavelength filter, a photodetector, or a wavelength tunable laser.

The above devices necessitate conjoint displacement of all the layers of one of the Bragg mirrors, and consequently relatively high electric fields, given the mechanical stiffness of the suspended structure. Moreover, they can provide only one optical signal processing function (tunable filtering), which limits their use in highly integrated optoelectronic components.

An object of the invention is to remedy some or all of the drawbacks previously cited.

SUMMARY OF THE INVENTION

To this end the invention proposes a semiconductor device comprising an alternation (or stack) of at least three semiconductor layers of chosen shape and two layers of air, and wherein said semiconductor layers have N-type and P-type doping different to or the same as the adjacent layer, being separated by I-type (not intentionally doped) semiconductor spacers to define a PINIP or NIPIN structure with cavities including at least two PIN substructures and adapted to have respective chosen electrical potentials applied to them.

Furthermore, in the above device, the respective thickness, composition and doping of the layers and spacers are chosen so that the structure has at least one optical transfer function adapted to light to be processed and adapted to be modulated as a function of the chosen potentials of the semiconductor layers.

In the case of an NIPIN or PINIP structure, each semiconductor layer which contributes simultaneously to a PIN substructure (or junction) and to an NIP substructure (or junction) can be displaced in one direction or in two opposite directions to vary either the transfer function of the substructure or the transfer functions of the structure. To this end it is sufficient, on the one hand, for the layer to be displaced to be at the interface between two substructures of different types (NIP and PIN) and, on the other hand, for the respective bias voltages of the substructures to be chosen appropriately. Any addition of a PIN or NIP substructure to the structure then increases the number of layers that can be displaced and consequently the number of spectral transfer functions that can be modulated.

Accordingly, by choosing the respective composition and thickness of the semiconductor layers and the spacers, the structure can provide one or more transfer functions adapted to be modulated and adapted to functions chosen from a group comprising at least wavelength filtering, switching and tunability (or other functions), as a function of the chosen succession of alternations.

In the case of an NIPIN, respectively PINIP structure, the two N-type, respectively P-type, outer layers on either side of the P-type, respectively N-type, central layer are advantageously at different electrical potentials so that the structure forms two PIN and NIP substructures disposed in series and respectively reverse-biased and forward-biased. In this case, the transfer function is modulated by the (electromechanical) displacement of the N-type, respectively P-type, central layer "upward or downward" relative to the two P-type, respectively N-type, outer layers, by varying the respective bias voltage applied to the PIN and NIP substructures.

Different and/or more complex embodiments can be envisioned. The device can in particular comprise one or more supplementary or additional N-type, respectively P-type, intentionally doped semiconductor layers placed on the upstream or downstream side of one of the N-type, respectively P-type, layers of the PINIP or NIPIN structure, and spaced therefrom by spacers that are either not intentionally doped (I-type) or intentionally doped (N-type or P-type) to form a new NIPINIP or PINIPIN, or NIPPPIN or PPPINIP or PINNNIP, or NNNIPPPIN or PPPINNNIP structure, for example.

This forms a multifunction device having a plurality of transfer functions adapted to be modulated and adapted to wavelength filtering, switching, tunability or like functions.

At least one semiconductor layer of the device can be active so that it is suitable for detecting or generating light.

Furthermore, the structure of the device can be formed on a substrate, possibly with interposed spacers having chosen dimensions and doping.

The semiconductor layers and the spacers are preferably made from III-V materials, in particular gallium arsenide (GaAs) or indium phosphide (InP). Moreover, these semiconductor layers and spacers are preferably produced by epitaxial techniques in conjunction with selective chemical etching techniques.

BRIEF DESCRIPTION OF THE DRAWINGS

Other features and advantages of the invention will appear on examining the following detailed description and the appended drawing, in which:

FIG. 1 is a diagrammatic perspective view of a PINIP device according to the invention suitable for switching, FIGS. 2A and 2B are views in cross section of a portion of the device shown in FIG. 1, respectively without biasing and with biasing, FIG. 2C shows the transfer functions of the devices from FIG. 2A (continuous line) and FIG. 2B (dashed line), FIGS. 3A to 3C are views in cross section of a portion of a variant of the device, respectively with no bias, with a first bias, and with a second bias, FIG. 4 shows the transfer functions of the devices from FIGS. 3A to 3C, and FIGS. 5A and 5B are side views of a portion of another variant of the device in which one of the layers is active, respectively with no bias and with bias.

DETAILED DESCRIPTION OF THE INVENTION

The accompanying drawings are for the most part definitive. Consequently, they can serve not only to complete the invention but can also contribute to defining it, if necessary.

A first embodiment of a device in accordance with the invention for optically processing external light is described first with reference to FIG. 1.

In the example shown in FIG. 1, the device comprises three semiconductor layers, of which two outer layers 1, 2 lie on respective opposite sides of a central layer 3. These layers preferably have substantially identical shapes. In the example shown, the layers have two ends 4, 5 of substantially rectangular shape, connected to each other by a blade 6-$i$ (in this example i=1 to 3) having an enlargement 7 in a central portion.

The adjacent layers are spaced by separation layers (also known as spacers) 8, 9. To be more precise, these spacers 8, 9 are formed at the ends 4, 5 of the semiconductor layers 1–3 so that their blades 6-$i$ are suspended and separated from each other by layers of air.

In a manner of speaking, each outer blade 6-1, 6-2 of an outer layer 1, 2 defines with the central blade 6-3 a vertical cavity 10-1, 10-2 whose height H1, H2 is fixed by the thickness of the spacers 8, 9.

As shown in the figures, the above kind of structure is preferably formed on a semiconductor substrate 13, with interposed spacers 14, so that the outer blade 6-2 is also suspended at a chosen distance (equal to the height of the spacers 14) above the substrate 13. A device of the above kind can be associated with coupling means (for example optical fibers) for introducing the light to be processed and collecting the processed light. According to the invention, the layers 1–3 and the spacers 8, 9, 14 are made from semiconductor materials, preferably III-V semiconductor materials. These materials are, for example, gallium arsenide (GaAs) or indium phosphide (InP), or InGaAs/InP or InAlAs/InGaAlAs heterostructures deposited on an InP substrate, or AlAs/GaAs heterostructures deposited on a GaAs substrate, or InGaP/GaAs heterostructures deposited on a GaAs substrate.

The above materials are merely preferred examples, of course.

In the example shown in FIG. 1, the outer semiconductor layers 1 and 2, which lie on respective opposite sides of the central semiconductor layer 3, are intentionally doped (N-type or P-type), and the central semiconductor layer 3 is intentionally doped (P-type or N-type), so that the doping types of two adjacent layers are different. Moreover, the spacers 8, 9 are made from semiconductor materials that are not intentionally doped (type I) so that the device constitutes a PINIP structure if the outer semiconductor layers 1 and 2 are P-type layers or an NIPIN structure if the two outer layers are N-type layers. The substrate 13 and the spacers 14 are preferably of type I.

The structure formed in this way is constituted of two PIN and NIP substructures which have a common layer, namely the central layer 3. In other words, in a PINIP structure, the PIN substructure shares its N-type doped layer with the NIP substructure and in an NIPIN structure the NIP substructure shares its P-type doped layer with the PIN substructure.

It is clear that each PIN or NIP substructure therefore constitutes a PIN junction familiar to the person skilled in the art.

To facilitate an understanding of the text, it is assumed hereinafter that in a PINIP structure the PIN junction is placed above the NIP junction. In other words, the P-type outer blade 6-1 is the upper blade and the P-type outer blade 6-2 is the lower blade.

The thickness and the composition of each semiconductor layer and of each spacer 1, 3, 14, and consequently the heights H1 and H2 of the cavities 10-1 and 10-2, are chosen as a function of the working wavelength of the device and the required transfer function. For example, and as shown in FIG. 2A (which is not to scale), the outer semiconductor layers 1 and 2 and the central semiconductor layer 3 can have an optical thickness substantially equal to $k\lambda/4$, where k is an odd integer, and the respective heights H1 and H2 of the two cavities 10-1 and 10-2 are substantially equal to $5\lambda/4$ (FIG. 2A). The spacers 14 have a chosen thickness equal to $\lambda/2$. Under the above conditions the structure is configured as a Bragg reflector (mirror) at the wavelength $\lambda$.

For example, for the device to operate as a switch, it is sufficient to modulate its transfer function so that it changes from the rest state providing a mirror function (FIG. 2A) to d state providing a transmitter function (FIG. 2B), and vice versa.

In accordance with the invention, the transfer function is modulated by electromechanically displacing at least one of the blades 6-$i$, preferably the central blade 6-3. To give preference to the displacement of this blade, it has a thickness of $\lambda/4$, for example, whereas the blades 6-1 and 6-2 have a thickness of $3\lambda/4$.

The displacement is obtained by choosing the respective bias voltage of each of the cavities 10-1, 10-2, or in other words by choosing the respective potential applied to the semiconductor layers of the structure.

As shown in FIG. 2A, in the absence of any bias, the central blade 6-3 is in a rest (or equilibrium) position. On the other hand, as shown in FIG. 2B, when the PIN junction (comprising the upper layer 1 and the central layer 3) is reverse-biased, and at the same time the NIP junction (comprising the central layer 3 and the lower layer 2) is forward-biased, the upper cavity 10-1 formed by the PIN junction is subjected to the whole of the electric field. The central blade 6-2 is consequently attracted toward the upper blade 6-1 over a chosen distance, depending on the potentials applied to the layers and on the characteristics of the cavities. The two PIN and NIP substructures being disposed in series, the biasing conditions described are simply obtained by applying to the blade 6-1 a negative potential relative to the blade 6-3. If this biasing is reversed by applying to the blade 6-3 a negative potential relative to the blade 6-1, the electric field is then applied to the lower cavity 10-2 and the blade 6-2 is attracted by the blade 6-3.

For example, if the vertical displacement of the central blade 6-3 is substantially equal to $\lambda/4$ (FIG. 2B) and the height H1 of the upper cavity 10-1 is substantially equal to $5\lambda/4$, then the new height of the cavity H'1 becomes equal to $5\lambda/4 - \lambda/4$, i.e. $\lambda$, for the first biasing situation envisioned. Similarly, the height H2 of the lower cavity 10-2 becomes H'2, equal to $5\lambda/4 + \lambda/4$, i.e. $3\lambda/2$. Under these biasing conditions the structure changes from the mirror state to the transmitter state over a wide range of wavelengths, enabling it to operate as a switch.

The transfer function of the structure in the rest state (FIG. 2A, continuous line) and when biased (FIG. 2B, dashed line) is shown in FIG. 2C for a configuration wavelength $\lambda=1.55$ $\mu$m; the substrate and the suspended blades are made of InP and the spacers are made of $In_{0.53}Ga_{0.47}As$.

Many other functions can be envisioned for other embodiments of the structure, for example the simultaneous provision in one and the same device of wavelength broadband or narrowband filtering functions combined with switching and wavelength tunability functions.

Tunability and switching are controlled by the bias voltages applied to the semiconductor layers.

The facility to provide a plurality of functions with one and the same structure constitutes an important advantage of the invention. To this end, one or more supplementary (or additional) semiconductor layers can be added to the PINIP structure shown in FIGS. 1 and 2 (or to a three-layer structure of some other type, for example the NIPIN type), on the upstream side and/or the downstream side of the outer layers 1 and 2, as shown by way of example in FIGS. 3A–3C, 5A and 5B.

To be more precise, in the example shown in FIG. 3A the structure, initially of the PINIP type, includes on the upstream side of (i.e. above) the P-type upper layer 1 an intentionally doped N-type first semiconductor layer 11 spaced from the upper layer 1 by semiconductor spacers 12 that are not intentionally doped (type I), and then, on top of this first layer 11, an intentionally doped N-type second semiconductor layer 15 spaced from the layer 11 by intentionally doped N-type semiconductor spacers 16. Moreover, the structure includes, on the downstream side of (i.e. below) the P-type lower layer 2, an intentionally doped N-type third semiconductor layer 17 spaced from the lower layer 2 by semiconductor spacers 18 that are not intentionally doped (type I). The first semiconductor layer 11, the second semiconductor layer 15 and the third semiconductor layer 17 have dimensions substantially identical to those of the other layers 1–3.

This NNNIPINIPIN structure delimits five air cavities 10-1 to 10-5 between the uppermost N-type doped layer 15 and the lowermost N-type doped layer 17.

The pairs of layers 15 and 11, on the one hand, and 2 and 17, on the other hand, constitute Bragg mirrors.

The optical thickness of the layers 1–3, 11, 15 and 17 is substantially equal to $k\lambda/4$, where k is an odd integer, and the respective thickness H1 to H5 of the cavities 10-1 to 10-5 is substantially equal to $5\lambda/4$, $\lambda/4$, $\lambda/2$, $\lambda/4$ and $5\lambda/4$. As shown by the dashed line transmittance curve in FIG. 4, a structure of the above kind, when it is not biased, is a band-pass filter whose optical transfer function transmits light with a center wavelength of approximately 1 550 nm.

It is possible to displace one or more layers, and consequently to modulate the optical transfer function of the structure, by modifying the potentials applied to the various layers, in other words by biasing certain PIN (or NIP) junctions.

To be more precise, and as shown in FIG. 3B, it is possible to change the nominal wavelength transmitted by the band-pass filter, for example to transmit light with a center wavelength of approximately 1 470 nm (see the left-hand curve in FIG. 4), by modulating the thickness of the central air cavity 10-3, whose optical thickness is $H3=\lambda/2$.

This modulation is obtained by displacing the central portion (blade 6-1) of the layer 1 downward by a distance $\delta$ and the central portion (blade 6-3) of the layer 3 upward, also by a distance $\delta$, so that the cavities 10-2 to 10-4 have respective heights H2, H3 and H4 substantially equal to $(\lambda/4)+\delta$, $(\lambda/2)-2\delta$ and $(\lambda/4)+\delta$. The structure therefore acts as a tunable filter.

Moreover, as shown in FIG. 3C, by modulating the thickness of The lower air cavity 10-5, whose optical thickness is $H5=5\lambda/4$, i.e. by degrading the reflectivity of one of the Bragg reflectors, the structure which operated in the rest condition (with no bias) as a filter, whose optical transfer function transmitted light with a center wavelength of approximately 1 550 nm, is converted into a reflector whose transmittance (transfer function) is shown in continuous line in FIG. 4.

This modulation is obtained by displacing the central portion (blade 6-17) of the lower layer 17 upward, over a distance $\lambda/4$, so that the cavity 10-5 has a height H5 substantially equal to $\lambda$ (instead of $5\lambda/4$). The structure then operates as a switch.

The structure shown in FIGS. 3A to 3C therefore provides at least the tunable filtering and switching functions over a wide range of wavelengths.

It will be noted here that because a NNNIPINIPIN stack is used, to apply the necessary bias voltage it is possible to apply an electric field to the terminals of any of the four cavities 10-2, 10-3, 10-4 and 10-5 using only three electrical contacts respectively connected to the outer layers 15 and 17 and to the intermediate layer 3.

More generally, other structures can be envisioned based on a PINIP or NIPIN structure, by replacing at least one of their semiconductor layers (initial type, N-type or P-type) with at least two semiconductor layers with the same type of doping (N-type or P-type) separated by spacers with the same type of doping (N-type or P-type) as the initial layer and having a shape substantially identical to the shape of the layers of the structure. It is therefore possible to form NIPPPIN, PPPINIP, PINNNIP, NNNIPPPIN or PPPINNNIP structures, for example.

As shown more clearly in FIG. 5A, the device can also include one or more active layers for generating or detecting light, combined with one or more passive functions of the kind previously referred to (filtering, tunability, switching, etc.).

In the present example, the upper part of the structure includes a PIN semiconductor substructure constituted of a P-type doped upper layer 1 spaced from an N-type doped lower layer 3 by spacers 8 that are not intentionally doped (I-type). Its lower portion includes (below the layer 3) two intentionally doped N-type semiconductor layers 19 and 20 spaced from each other and from the layer 3 by N-type doped semiconductor spacers 21 and 22. The structure further includes, below and against the layer 20, active layers forming a vertical cavity surface emitting laser 23 and, below and in contact with the laser 23, alternating semiconductor layers of two types forming a lower Bragg mirror 24.

In this example, the alternating air cavities and semiconductor layers disposed on top of the laser 23 form an upper Bragg mirror. Here the cavities 10-1 to 10-3 have respective heights H1, H2 and H3 substantially equal to $5\lambda/4$, $\lambda/4$ and $\lambda/4$.

In the rest condition (with no bias) the upper portion of the structure constituted of the layers 1, 3, 19 and 20 acts as a mirror and the light generated by the laser 23 is constrained to exit from the structure via the lower Bragg mirror 24 (in the direction of the arrow F1).

On the other hand, if the upper portion of the structure (forming the upper Bragg mirror) is biased appropriately, one or more of the suspended blades can be constrained to move to modify the height H1 of the cavity 10-1. In the example shown in FIG. 5B, the blade 6-1 of the layer 1 is displaced downward, by a distance equal to approximately $\lambda/4$, so that the height H1 of the cavity 10-1 changes from $5\lambda/4$ to $\lambda$. This modulation of the reflectivity of the upper Bragg mirror modifies its transfer function and confers on it a transmission function. The emission from the laser is then preferentially directed upward, so constraining the emitted light to exit via the top of the structure, in the direction of the arrow F2.

In this embodiment, the structure therefore acts as a light generator and as a switching device.

The devices according to the invention are preferably produced by an epitaxial technique combined with one or more selective chemical etching techniques. Various epitaxial techniques can be envisioned, provided that they enable the thickness of the layers to be controlled on the atomic layer scale. Molecular beam epitaxy (MBE) is one example, or low-pressure metallo-organic chemical vapor phase deposition (LP-MOCVD), or chemical beam epitaxy (CBE).

These techniques enable control of the thickness on the atomic layer scale and assure excellent crystalline qualities and very sharp interfaces. Moreover, they offer very accurate control of composition and doping. Finally, they provide excellent control of residual mechanical stresses.

There are many chemical etching techniques, including wet etching, for selectively micromachining the suspended portions (blades). Examples of wet etching techniques include the $FeCl_3:H_2O$ or $HF:H_2O_2:H_2O$ technique for the InGaAs/InP system, the $HCl:H_2O$ or $HCl:H_3PO_4$ technique for the InAlAs/InGaAlAs and GaInP/GaAs systems, and the HF technique for the AlAs/GaAs system.

Of course, these are merely examples of growth and etching techniques, of which there are others.

Moreover, the voltages are applied to the semiconductor layers via ohmic contacts, preferably made from AuGe, Pd—AuGe, or Ti—Pt—Au alloys. These contacts are formed on the two outermost layers of the structure, or on each semiconductor layer of the structure, of course, or on the outer layers and on certain intermediate layers. As previously indicated, it is particularly advantageous to use III-V materials for the semiconductor layers and the spacers. This is because, as previously indicated, III-V material heterostructures have very low and, more importantly, well-controlled residual mechanical stresses, which makes the suspended blades relatively highly flexible, which is indispensable for displacing them electromechanically.

Nevertheless, other materials can be envisioned. Examples are crystalline silicon and polycrystalline silicon. Crystalline silicon structures can be obtained using SOI technologies that etch silica ($SiO_2$) layers, better known as the "smart cut" technique.

Polycrystalline structures can be envisioned, but the flexibility of the blades is then poor, because of the poor control of mechanical stresses and the possibility of absorption of light, which limit filtering applications.

Moreover, at present silicon cannot be used in devices integrating active layers. Consequently, they can be used only in the form of passive components.

Devices according to the invention offer many advantages, in that they have small dimensions enabling them to be used in highly integrated electronic components. For example, they can be used as tunable lasers on GaAs or InP, as tunable resonant or non-resonant photodetectors, or as modulators, using the switching functions at a given wavelength (the modulation can be of the synchronous detection type so that detection is effected by a modulated payload signal free of modulated spuriae that are experienced when using a chopper).

Many other applications can be envisioned, however, in the field of optical telecommunications, industrial control (for example in the agriculture/foodstuffs industry), microspectrometry, in particular in the field of the environment (detection of transmission or absorption of gas), or in the medical analysis field.

Generally speaking, the device according to the invention is particularly suitable for optical processing of signals.

The invention is not limited to the device embodiments described above by way of example only, and encompasses all variants thereof within the scope of the following claims that will be evident to the skilled person.

What is claimed is:

1. A semiconductor device, comprising an alternation of at least three semiconductor layers of chosen shape and two layers of air, and wherein:
    at least two of said semiconductor layers have the same N-type, respectively P-type, doping, at least a third layer has P-type, respectively N-type, doping, and said layers are separated by spacers with respective types of doping chosen to define a structure with air cavities including at least two PIN substructures and adapted to have respective chosen electrical potentials applied to them, and
    the respective thickness, composition and doping of said layers and spacers are chosen so that the structure has at least one optical transfer function adapted to light to be processed and adapted to be modulated as a function of the chosen potentials applied to the semiconductor layers in order to deform them electrostatically.

2. A device according to claim 1, wherein the respective thickness, composition and doping of said semiconductor layers and spacers are chosen so that the structure has at least one transfer function adapted to be modulated and adapted to a function chosen from the group comprising at least wavelength filtering, switching and tunability.

3. A device according to claim 1, which comprises at least one stack constituted of two N-type doped layers on respective opposite sides of a P-type doped layer, said layers being separated by I-type spacers that are not intentionally doped to form an NIPIN structure, said N-type doped layers being adapted to have different potentials applied to them so that the structure defines two NIP and PIN substructures disposed in series, one of which substructures is reverse-biased and the other of which substructures is forward-biased, and said transfer function is modulated by displacement of said P-type doped layer relative to the two N-type doped layers by varying the respective bias voltage applied to the NIP and PIN substructures.

4. A device according to claim 1, which comprises at least one stack constituted of two P-type doped layers on respective opposite sides of an N-type doped layer, said layers being separated by I-type spacers that are not intentionally doped, to form a PINIP structure, said P-type doped layers being adapted to have different potentials applied to them so that the structure defines two PIN and NIP substructures disposed in series, one of which substructures is reverse-biased and the other of which substructures is forward-biased, and said transfer function is modulated by displacement of said N-type doped layer relative to the two P-type doped layers by varying the respective bias voltage applied to the PIN and NIP substructures.

5. A device according to claim 3, which includes at least one additional semiconductor layer having the same type of doping as at least one of the semiconductor layers forming a PINIP or NIPIN structure, spaced from said at least one layer by spacers having the same type of doping as itself, and having a shape substantially identical to the shape of the layers of the structure.

6. A device according to claim 1, wherein the respective thickness and composition of the semiconductor layers and the spacers are chosen so that the structure has an optical transfer function adapted to be modulated to provide selective wavelength tunable filtering.

7. A device according to claim 1, wherein the respective thickness and composition of the semiconductor layers and the spacers are chosen so that the structure has at least one supplementary optical transfer function adapted to be modulated to provide a function chosen from a group comprising wavelength filtering, switching and tunability.

8. A device according to claim 1, which includes at least one active semiconductor layer adapted to detect or generate light.

9. A device according to claim 1, wherein at least two of said layers comprise an ohmic contact adapted to apply an electrical potential.

10. A device according to claim 1, which is formed on a substrate.

11. A device according to claim 1, which is formed on said substrate with interposed spacers with chosen dimensions and doping.

12. A device according to claim 1, wherein the semiconductor layers and the spacers are made from III-V materials, in particular gallium arsenide or indium phosphide.

13. A device according to claim 1, wherein said semiconductor layers and said spacers are produced by epitaxial and selective chemical etching techniques.

14. A device according to claim 4, which includes at least one additional semiconductor layer having the same type of doping as at least one of the semiconductor layers forming a PINIP or NIPIN structure, spaced from said at least one layer by spacers having the same type of doping as itself, and having a shape substantially identical to the shape of the layers of the structure.

* * * * *